(12) United States Patent
Avila et al.

(10) Patent No.: US 8,307,241 B2
(45) Date of Patent: Nov. 6, 2012

(54) DATA RECOVERY IN MULTI-LEVEL CELL NONVOLATILE MEMORY

(75) Inventors: Chris Nga Yee Avila, Sunnyvale, CA (US); Jonathan Hsu, Newark, CA (US); Alexander Kwok-Tung Mak, Los Altos Hills, CA (US); Jian Chen, Menlo Park, CA (US); Grishma Shailesh Shah, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 732 days.

(21) Appl. No.: 12/485,846

(22) Filed: Jun. 16, 2009

(65) Prior Publication Data
US 2010/0318839 A1 Dec. 16, 2010

(51) Int. Cl.
*G06F 11/00* (2006.01)
(52) U.S. Cl. .......................................................... 714/6.2
(58) Field of Classification Search ................. 714/764, 714/6.2
See application file for complete search history.

(56) References Cited

U.S. PATENT DOCUMENTS

| | | | |
|---|---|---|---|
| 5,798,968 A | 8/1998 | Lee et al. | |
| 5,838,894 A | 11/1998 | Horst | |
| 5,862,074 A * | 1/1999 | Park ........................ | 365/185.03 |
| 5,867,429 A | 2/1999 | Chen et al. | |
| 5,890,192 A | 3/1999 | Lee et al. | |
| 6,266,273 B1 | 7/2001 | Conley et al. | |
| 6,763,424 B2 | 7/2004 | Conley | |
| 6,937,510 B2 * | 8/2005 | Hosono et al. ........... | 365/185.03 |
| 7,061,798 B2 | 6/2006 | Chen et al. | |
| 7,120,051 B2 | 10/2006 | Gorobets et al. | |
| 7,158,421 B2 | 1/2007 | Li et al. | |
| 7,193,896 B2 * | 3/2007 | Shiga ........................ | 365/185.09 |
| 7,315,916 B2 * | 1/2008 | Bennett et al. ................ | 711/103 |
| 7,409,473 B2 | 8/2008 | Conley et al. | |
| 7,412,560 B2 | 8/2008 | Smith et al. | |
| 7,447,078 B2 | 11/2008 | Li | |
| 7,463,521 B2 | 12/2008 | Li | |
| 7,475,174 B2 | 1/2009 | Chow et al. | |
| 7,480,181 B2 | 1/2009 | Li | |
| 7,490,283 B2 | 2/2009 | Gorobets et al. | |
| 7,502,260 B2 | 3/2009 | Li et al. | |
| 7,505,320 B2 | 3/2009 | Li | |
| 7,586,784 B2 * | 9/2009 | Roohparvar ............. | 365/185.12 |
| 7,594,157 B2 * | 9/2009 | Choi et al. ..................... | 714/764 |
| 7,755,950 B2 * | 7/2010 | Yu et al. ................... | 365/185.28 |
| 7,761,740 B2 | 7/2010 | Kern et al. | |
| 7,827,348 B2 * | 11/2010 | Lee et al. ...................... | 711/103 |
| 7,873,778 B2 | 1/2011 | Choi et al. | |
| 7,934,074 B2 * | 4/2011 | Lee et al. ...................... | 711/217 |

(Continued)

OTHER PUBLICATIONS

Cardinal Search Report, "2001.22 Lower Page Program Failure Handling with Internal Memory Latch XDL," prepared Jan. 22, 2009. Cardinal Intellectual Property, Inc.

(Continued)

*Primary Examiner* — Stephen M Baker
(74) *Attorney, Agent, or Firm* — Weaver Austin Villeneuve & Sampson, LLP

(57) ABSTRACT

In a nonvolatile memory array, data is stored in multi-level cells (MLC) as upper-page data and lower-page data. Safe copies of both upper-page and lower-page data are stored in on-chip cache during programming. If a write fail occurs, data is recovered from on-chip cache. The controller does not have to maintain safe copies of data.

20 Claims, 6 Drawing Sheets

U.S. PATENT DOCUMENTS

| | | | |
|---|---|---|---|
| 7,945,825 B2 * | 5/2011 | Cohen et al. | 714/721 |
| 8,046,528 B2 * | 10/2011 | Chu et al. | 711/103 |
| 8,132,045 B2 | 3/2012 | Avila et al. | |
| 8,134,872 B2 * | 3/2012 | Roohparvar | 365/185.12 |
| 2004/0188710 A1 | 9/2004 | Koren et al. | |
| 2005/0141312 A1 | 6/2005 | Sinclair et al. | |
| 2005/0204187 A1 | 9/2005 | Lee et al. | |
| 2006/0031593 A1 | 2/2006 | Sinclair | |
| 2006/0136656 A1 | 6/2006 | Conley et al. | |
| 2006/0184720 A1 | 8/2006 | Sinclair et al. | |
| 2006/0198202 A1 | 9/2006 | Erez | |
| 2006/0271748 A1 | 11/2006 | Jain et al. | |
| 2007/0101096 A1 | 5/2007 | Gorobets | |
| 2007/0140036 A1 | 6/2007 | Noguchi et al. | |
| 2008/0016269 A1 | 1/2008 | Chow et al. | |
| 2008/0183949 A1 | 7/2008 | Ly et al. | |
| 2008/0195804 A1 | 8/2008 | Kim et al. | |
| 2008/0250195 A1 | 10/2008 | Chow et al. | |
| 2008/0316816 A1 | 12/2008 | Lin | |
| 2009/0276474 A1 | 11/2009 | Sela et al. | |
| 2010/0030951 A1 | 2/2010 | Kim | |
| 2010/0257308 A1 | 10/2010 | Hsu et al. | |
| 2010/0318721 A1 | 12/2010 | Avila et al. | |

OTHER PUBLICATIONS

U.S. Office Action dated Jan. 5, 2011 issued in U.S. Appl. No. 12/485,827.

U.S. Final Office Action dated May 23, 2011 issued in U.S. Appl. No. 12/485,827.

U.S. Notice of Allowance dated Oct. 28, 2011 issued in U.S. Appl. No. 12/485,827.

U.S. Office Action dated Oct. 31, 2011 issued in U.S. Appl. No. 12/487,063.

U.S. Final Office Action dated Mar. 15, 2012 issued in U.S. Appl. No. 12/487,063.

Cardinal Search Report, "2001.21 Lower Page Program Failure Handling with Internal Memory Latch XDL," prepared Jan. 21, 2009. Cardinal Intellectual Property, Inc., 40 pp.

Cardinal Search Report, "200 1.43 SD Stop Transmission Handling Through Address Change Command Sequence," prepared Mar. 19, 2009. Cardinal Intellectual Property, Inc., 6 pp.

* cited by examiner

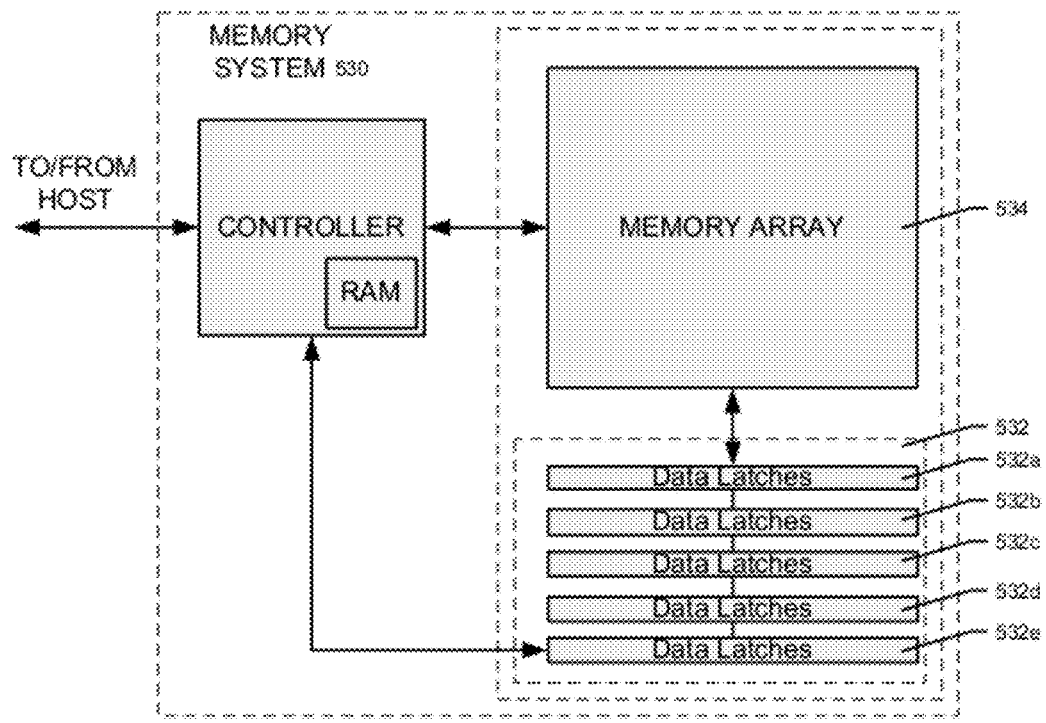
*FIG. 5*
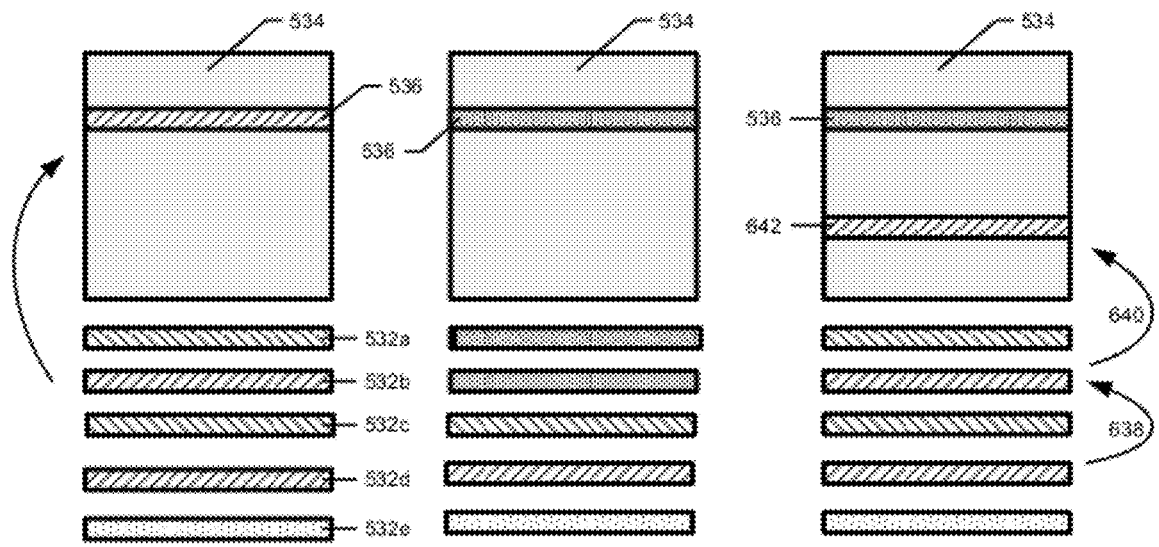
*FIG. 6A*  *FIG. 6B*  *FIG. 6C*

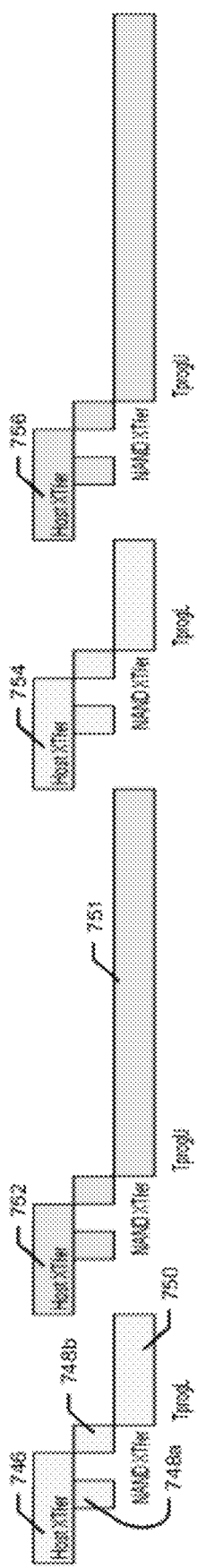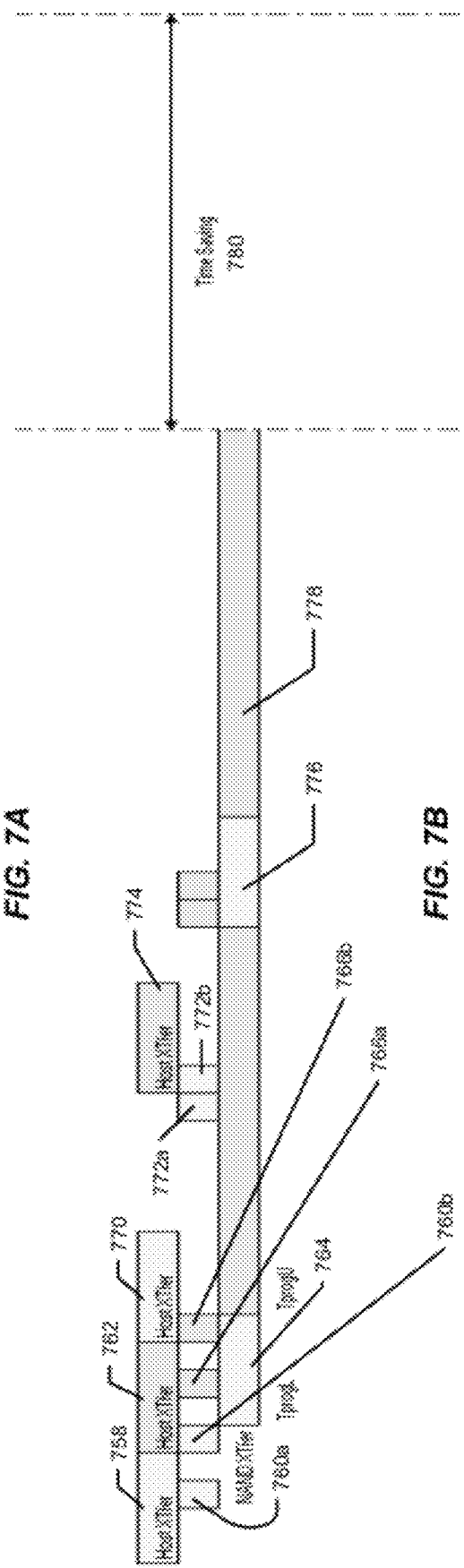
FIG. 7A
FIG. 7B

DATA RECOVERY IN MULTI-LEVEL CELL NONVOLATILE MEMORY

BACKGROUND OF THE INVENTION

This invention relates to nonvolatile memory systems and methods of operating nonvolatile memory systems. In particular, this application relates to handling of program failure in nonvolatile memory.

Nonvolatile memory systems are used in various applications. Some nonvolatile memory systems are embedded in a larger system such as a personal computer. Other nonvolatile memory systems are removably connected to a host system and may be interchanged between different host systems. Examples of such removable memory systems include memory cards and USB flash drives. Electronic circuit cards, including non-volatile memory cards, have been commercially implemented according to a number of well-known standards. Memory cards are used with personal computers, cellular telephones, personal digital assistants (PDAs), digital still cameras, digital movie cameras, portable audio players and other host electronic devices for the storage of large amounts of data. Such cards usually contain a re-programmable non-volatile semiconductor memory cell array along with a controller that controls and supports operation of the memory cell array and interfaces with a host to which the card is connected. Several of the same type of card may be interchanged in a host card slot designed to accept that type of card. However, the development of the many electronic card standards has created different types of cards that are incompatible with each other in various degrees. A card made according to one standard is usually not useable with a host designed to operate with a card of another standard. Memory card standards include PC Card, CompactFlash™ card (CF™ card), SmartMedia™ card, MultiMediaCard (MMC™), Secure Digital (SD) card, a miniSD™ card, Subscriber Identity Module (SIM), Memory Stick™, Memory Stick Duo card and microSD/TransFlash™ memory module standards. There are several USB flash drive products commercially available from SanDisk Corporation under its trademark "Cruzer®." USB flash drives are typically larger and shaped differently than the memory cards described above.

Different types of flash memory array architecture are used in nonvolatile memory systems. In one type of architecture, a NAND array, strings of more than two memory cells, such as 16 or 32, are connected along with one or more select transistors between individual bit lines and a reference potential to form columns of cells. Word lines extend across cells within a large number of these columns.

An individual flash memory cell may hold one bit of data in what is known as a Single Level Cell (SLC) memory. In some examples, a memory cell may hold two or more bits of data in what is known as a Multi Level Cell (MLC) memory.

When data is written to a nonvolatile memory array, a program failure may occur because of a physical defect in the memory array, or for some other reason. Dealing with such program failures, especially in MLC memory systems, can be problematic and some approaches are costly because they use a lot of controller resources.

SUMMARY OF THE INVENTION

A nonvolatile memory system according to an embodiment uses an on-chip cache to maintain safe copies of both upper-page and lower-page data as the data is written to a nonvolatile memory array. If a write fail occurs, then data may be recovered from the on-chip cache. Because safe copies are maintained in on-chip cache, the controller does not need to maintain safe copies and controller RAM may be smaller than it would otherwise be. An on-chip cache may have a sufficient number of page buffers to hold safe copies of all data that is in danger (e.g. upper-page data, lower-page data, and any middle-page data), in addition to target copies used for programming.

A method of managing data transfer from a host to a nonvolatile memory array that stores more than one bit per cell according to an embodiment comprises: storing safe copies of upper-page data and lower-page data in an on-chip cache at the same time, during writing the upper-page data and lower-page data to the nonvolatile memory array; and when a write failure occurs during writing, then recovering the upper-page data from the on-chip cache.

One example includes, when a write failure occurs during writing, then recovering the lower-page data from the on-chip cache. The memory array may store more than two bits per cell so that middle-page data is stored in cells of the memory array. A safe copy of any middle-page data may be stored in the on-chip cache, at the same time as storing safe copies of the upper-page data and lower-page data, and when a write failure occurs, then recovering the middle-page data from the on-chip cache. The upper-page data may be data to be programmed to cells of a first word line, and the lower-page data may be data to be programmed to the cells of the first word line. The upper-page data may be data to be programmed to cells of a first word line, and the lower-page data may be data to be programmed to cells of a second word line. The lower-page data may consist of data for two or more die-pages, and data for an individual die-page may be displaced from the memory controller as the individual die-page data is stored in the on-chip cache, prior to completion of storage of data of all die-pages of the lower-page data in the on-chip cache.

A method of managing data in a memory system that includes a memory controller and a buffered memory array according to an embodiment comprises: buffering lower-page data in an on-chip cache; discarding the lower-page data from the memory controller prior to writing the lower-page data to the memory array; buffering upper-page data in the on-chip cache; discarding the upper-page data from the memory controller prior to writing the upper-page data to the memory array; and if the writing of upper-page data is unsuccessful, then recovering the upper-page data from the on-chip cache. If the writing of upper-page data is unsuccessful, then the lower-page data may be recovered from the on-chip cache.

A memory system according to an embodiment comprises: a memory controller; a nonvolatile memory array that stores at least a lower-page bit and an upper-page bit in each cell; and an on-chip cache interposed between the memory controller and the nonvolatile memory array, wherein the on-chip cache concurrently maintains safe copies of upper-page data and lower-page data to be written to a group of cells of the memory array until the upper-page data and the lower-page data are confirmed as written, the upper-page data and lower-page data being removed from the memory controller prior to being confirmed as written. In an example, the on-chip cache comprises five page buffers, an input page buffer, two safe copy page buffers, and two target copy page buffers.

BRIEF DESCRIPTION OF THE DRAWINGS

FIG. 5 shows a memory system that includes an on-chip cache with five page buffers.

FIG. 6A shows writing of upper-page data to a memory array.

FIG. 6B shows a write fail during writing of upper-page data.

FIG. 6C shows recovery of data from safe copies in on-chip cache after write fail.

FIG. 7A is a timing diagram for data transfer in a memory system that maintains a safe copy of data in controller RAM.

FIG. 7B is a timing diagram for data transfer in a memory system that maintains safe copies of upper-page and lower-page data in on-chip cache.

DETAILED DESCRIPTION OF ILLUSTRATED EMBODIMENTS

Figure 1:
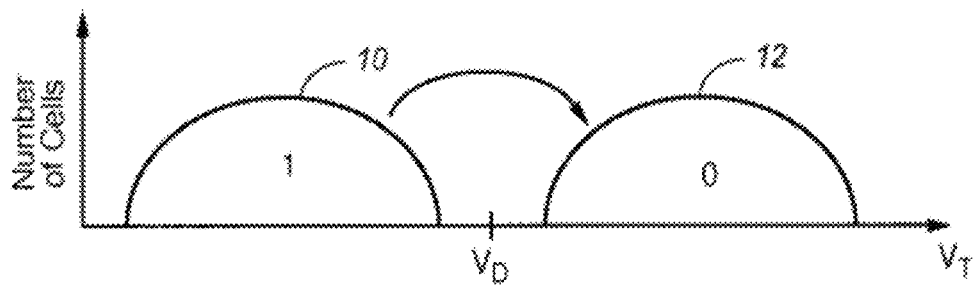
FIG. 1 shows programming of an SLC memory.

It is common in current commercial products for each storage element of a flash EEPROM array to store a single bit of data by operating in a binary mode, where two ranges of threshold voltage of the storage element transistors are defined as two memory states. The threshold voltages of transistors correspond to ranges of charge levels stored on their storage elements. In addition to shrinking the size of the memory arrays, the trend is to further increase the density of data storage of such memory arrays by storing more than one bit of data in each storage element transistor. This is accomplished by defining more than two threshold voltage levels as memory states for each storage element transistor, four such states (2 bits of data per storage element) being used in one example. More storage states, such as 16 states (4 data bits) per storage element may also be used. Each storage element memory transistor has a certain total range (window) of threshold voltages in which it may practically be operated, and that range is divided into the number of states defined for it plus margins between the states to allow for them to be clearly differentiated from one another.

As the number of states stored in each memory cell increases, the tolerance of any shifts in the programmed charge level on the storage elements decreases. Since the ranges of charge designated for each memory state must necessarily be made narrower and placed closer together as the number of states stored on each memory cell storage element increases, the programming (or writing, the terms are used interchangeably in the present application) must be performed with an increased degree of precision and the extent of any post-programming shifts in the stored charge levels that can be tolerated, either actual or apparent shifts, is reduced. Actual disturbs to the charge stored in one cell can be created when programming and reading that cell, and when reading, programming and erasing other cells that have some degree of electrical coupling with that cell, such as those in the same column or row, and those sharing a line or node.

Apparent shifts in the stored charge levels occur because of field coupling between storage elements. The degree of this coupling is necessarily increasing as the spaces between memory cell storage elements are being decreased, which is occurring as the result of improvements of integrated circuit manufacturing techniques. The problem occurs most pronouncedly between two groups of adjacent cells that have been programmed at different times. One group of cells is programmed to add a level of charge to their storage elements that corresponds to one set of data. After the second group of cells is programmed with a second set of data, the charge levels read from the storage elements of the first group of cells often appear to be different than programmed because of the effect of the charge on the second group of storage elements being capacitively coupled with the first. This is known as the Yupin effect, and is described in U.S. Pat. No. 5,867,429. This patent describes either physically isolating the two groups of storage elements from each other, or taking into account the effect of the charge on the second group of storage elements when reading that of the first group. Various programming schemes may be used to reduce Yupin effect. In particular, programming of MLC memory may be done in stages, a first stage is performed to bring a group of memory cells close to their desired charge levels. Then, only after neighboring cells have undergone at least a first stage, a second stage is performed to bring the cells to their desired levels. Thus, the final charge levels reflect changes caused by programming of neighboring cells.

Because of the higher precision required in programming MLC memory, more time is generally needed than for programming SLC memory. Also, programming in multiple steps to reduce apparent shifts in charge levels may take more time. This means that MLC storage, though more efficient in using space in a memory array, may be slower than SLC memory, at least for programming. In order to take advantage of the storage efficiency of MLC memory and the speed of SLC memory, data may initially be written to SLC memory and later copied to MLC memory. Once all data from an SLC block is copied to an MLC block, the SLC block may be erased so that it becomes available for subsequent use.

FIG. 1 shows programming of a SLC memory. The threshold voltage ($V_T$) of a cell is mapped to two distinct ranges representing two memory states and threshold voltages of individual cells are represented by distributions 10, 12 shown for logical state 1 and logical state 0 respectively. An erased memory cell represents a logic 1 state. A programmed cell represents a logic 0 state. Generally, memory cells are erased together in a unit of a block (erase block) so that all cells in the block are brought to the logic 1 state together. Cells are generally programmed together in units of a page, where a block consists of one or more pages. In one example, a NAND flash memory consists of blocks of cells, with each block consisting of multiple pages that are formed by rows of memory cells. Examples of NAND flash memory systems and their operation are provided in U.S. Pat. No. 7,061,798. During programming, cells that are to hold a logical 0 have their threshold voltage increased as shown, while cells that are to hold a logical 1 remain at their erased threshold voltage. Programming may include a series of pulse and verify steps. Once the cells are programmed, the state of a cell is read by comparing the threshold voltage of the cell to a discrimination voltage ($V_D$). Thus, any cell having a threshold voltage less than $V_D$ is read as storing a 1, and any cell having a threshold voltage greater than $V_D$ is read as storing a 0.

Figure 2A:
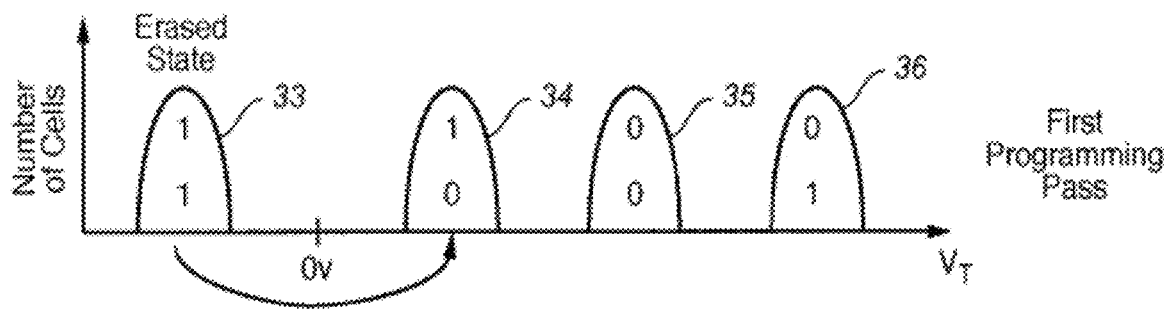
FIG. 2A shows a first stage of programming an MLC memory.

FIG. 2A shows a first stage of programming MLC memory. In particular, FIG. 2A shows the threshold voltage of a cell having four different threshold voltage ranges assigned to four different memory states 33-36. The erased state 33 has the lowest threshold voltage range, indicated by a threshold voltage less than 0 volts in this example. The first programming stage of FIG. 2A programs some cells to the next state, state 34 and leaves others in erased state 33. This programming stage (first pass) generally programs cells of a page of memory together and the bits programmed in this way may be considered as a logical page (lower page). Thus, after the first pass programming of FIG. 2A a first logical page has been programmed and all cells of the physical page in the memory array are either in the erased state 33 or first programmed state 34. Programming may be achieved by a series of programming pulses with verification performed between pulses.

Figure 2B:
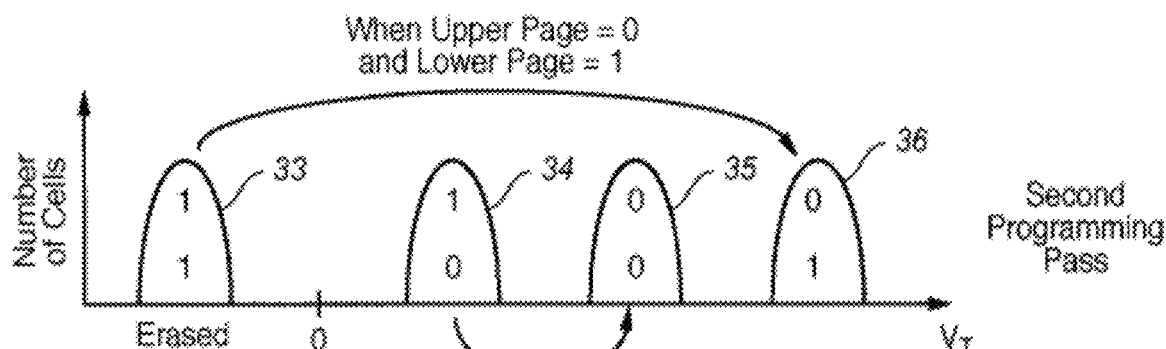
FIG. 2B shows a subsequent second stage of programming the MLC memory of FIG. 2A.

FIG. 2B shows a second programming stage (second pass) that is performed subsequent to the first stage of FIG. 2A. In this stage, cells are programmed according to bits of a second logical page (upper page). For cells storing a 1 in the upper page, the memory state remains in erased state 33 or first programmed state 34. For cells storing a 0 in the upper page, the memory state is programmed to second programmed state 35 or third programmed state 36 as shown. Cells in erased state 33 are programmed to third programmed state 36 and cells in first programmed state 34 are programmed to second programmed state 35 as shown. Thus, after the second programming stage, a cell may be in any one of four possible memory states as determined by an upper page bit and a lower page bit as indicated by bits shown in distributions of cells in states 33-36. It will be understood that FIGS. 2A and 2B show an exemplary scheme and other schemes may also be used to program MLC memory.

While storing larger amounts of data per unit area in a memory array is achievable using MLC as compared with SLC, reducing the speed of programming is generally not desirable and may not be acceptable for certain applications. In particular, for removable mass storage applications (e.g. in flash memory cards or USB flash drives), hosts may require data to be stored within a specified maximum time. In order to take advantage of the storage efficiency of MLC without suffering a time penalty, data may initially be stored in SLC and later stored in MLC at a time when resources are available, e.g. data may be moved to MLC as a background operation. When the data is stored in SLC, an indication may be sent to the host indicating that the data is stored. Thus, the host sees data storage taking place at the speed of SLC storage. Subsequent storage in MLC may be transparent to the host. As long as transfer of data from SLC memory to MLC memory takes place in a timely manner, the extra space occupied by data in SLC memory may not have a significant impact.

Many memory chips have some form of latches or registers that hold data prior to, or during, programming of data to the memory array. Such latches may be used to as an on-chip cache to provide faster transfer of data. Examples of such on-chip cache are provided in US Patent Application Publication No. 2006/0136656, which is hereby incorporated by reference for all purposes. Additional examples of how data latches may be used for caching data on a memory chip are provided in U.S. Pat. No. 7,505,320, which is hereby incorporated by reference for all purposes.

Figure 3:
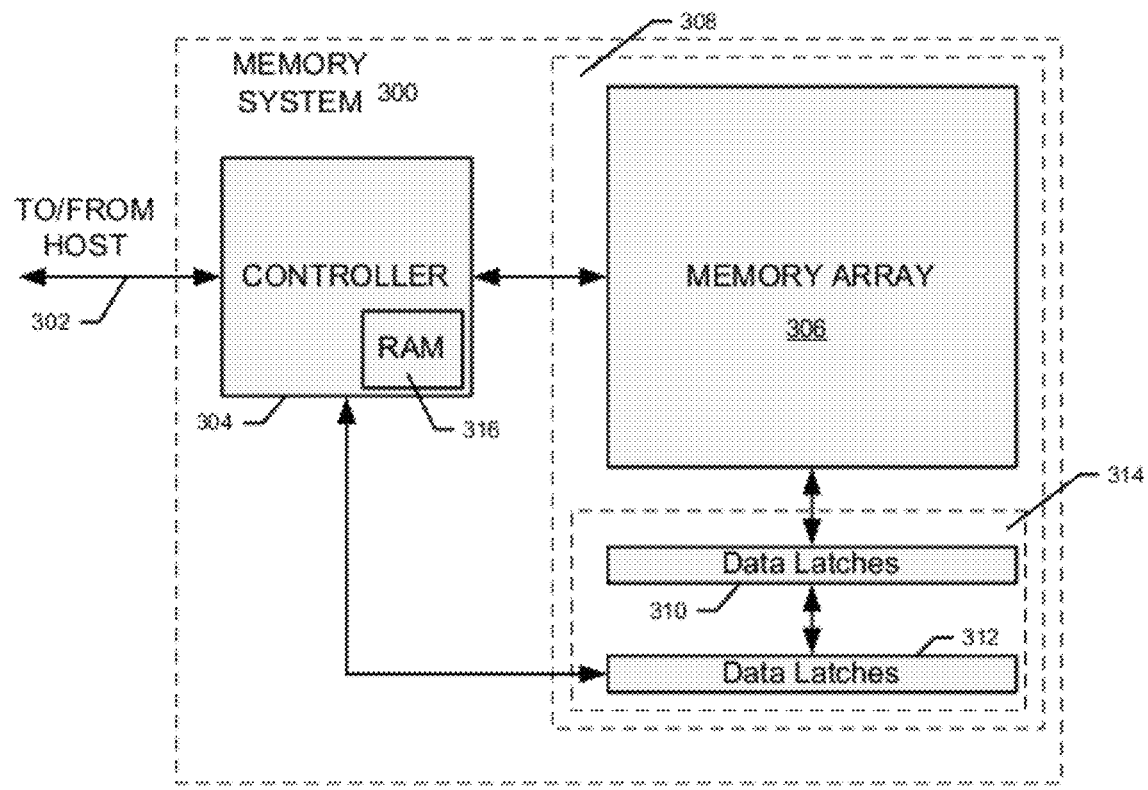
FIG. 3 shows an example of a memory system in communication with a host.

FIG. 3 shows an example of a memory system 300 that may be embodied in a memory card, USB flash drive, or other removable nonvolatile memory system. FIG. 3 shows communication to and from a host, which generally occurs through a standardized interface 302. Such an interface is generally established by a standard that dictates the physical arrangement of contacts and the details of how communication is to occur between the host and memory system. The memory system 300 includes a controller 304 that manages communication with the host and also manages how data is stored in the memory array 306. In a typical arrangement, the memory controller determines where particular data is stored in the memory array and maintains a logical-to-physical mapping that relates logical addresses provided by the host to physical addresses in the memory array. FIG. 3 shows the controller 304 on a separate chip to the memory array 306, though in some examples, the controller may be on the same chip as the controller. The memory chip 308 includes two sets of data latches 310, 312 that may be considered together as an on-chip cache 314. "On-chip" here indicates that the data latches are on the same chip as the memory array, and the data latches may be considered as peripheral circuits on the memory chip 308. The on-chip cache may also be considered to be a buffer for the memory array 306, and a memory array having such a buffer may be referred to as a buffered memory array. Data latches 310, 312 are connected to bit lines so that the data to be written to a page is stored in a set of data latches which form a page buffer. Thus, the sets of data latches shown form two page buffers 310, 312, each of which contains data to be written to one page of the memory array 306. In some examples, data for a lower page may be held in one page buffer while data for an upper page is held in another page buffer. The controller 304 also includes a volatile memory (controller RAM 316) which may be used to store data from the host prior to storing it in the memory array.

In a typical arrangement, the memory array is programmed in a unit called a page which extends along a word line. In such an arrangement, a page forms the minimum unit of programming. Because each cell holds more than one bit, a word line holds more than one page. For example, where cells of a word line each store two bits of data, the word line stores two pages of data, commonly referred to as lower-page and upper-page data. A page may be programmed once with data. However, if the page is subsequently programmed with additional data (without first erasing the original data) the original data may be corrupted by the subsequent programming.

Memory cells of a typical flash EEPROM array are divided into discrete blocks of cells that are erased together. That is, the block is the erase unit, a minimum number of cells that are simultaneously erasable. Each block typically stores one or more pages of data, the page being the minimum unit of programming and reading, although more than one page may be programmed or read in parallel in different sub-arrays or planes. Each page typically stores one or more sectors of data, the size of the sector being defined by the host system. An example sector includes 512 bytes of user data, following a standard established with magnetic disk drives, plus some number of bytes of overhead information about the user data and/or the block in which they are stored. Such memories are typically configured with 16, 32 or more pages within each block, and each page stores one or just a few host sectors of data.

In order to increase the degree of parallelism, and thus improve performance, during programming user data into the memory array and reading user data from it, the array is typically divided into sub-arrays, commonly referred to as planes, which contain their own data registers and other circuits to allow parallel operation such that sectors of data may be programmed to or read from each of several or all the planes simultaneously. An array on a single integrated circuit may be physically divided into planes, or each plane may be formed from a separate one or more integrated circuit chips. Examples of such a memory implementation are described in U.S. Pat. Nos. 5,798,968 and 5,890,192.

To further efficiently manage the memory, blocks may be linked together to form virtual blocks or metablocks. That is, each metablock is defined to include one block from each plane. Use of the metablock is described in U.S. Pat. No. 6,763,424, which is hereby incorporated by reference in its entirety, for all purposes. The metablock is identified by a host logical block address as a destination for programming and reading data. Similarly, all blocks of a metablock are erased together. The controller in a memory system operated with such large blocks and/or metablocks performs a number of functions including the translation between logical block addresses (LBAs) received from a host, and physical block numbers (PBNs) within the memory cell array. Individual pages within the blocks are typically identified by offsets within the block address. Address translation often involves use of intermediate terms of a logical block number (LBN) and logical page.

Figure 4:
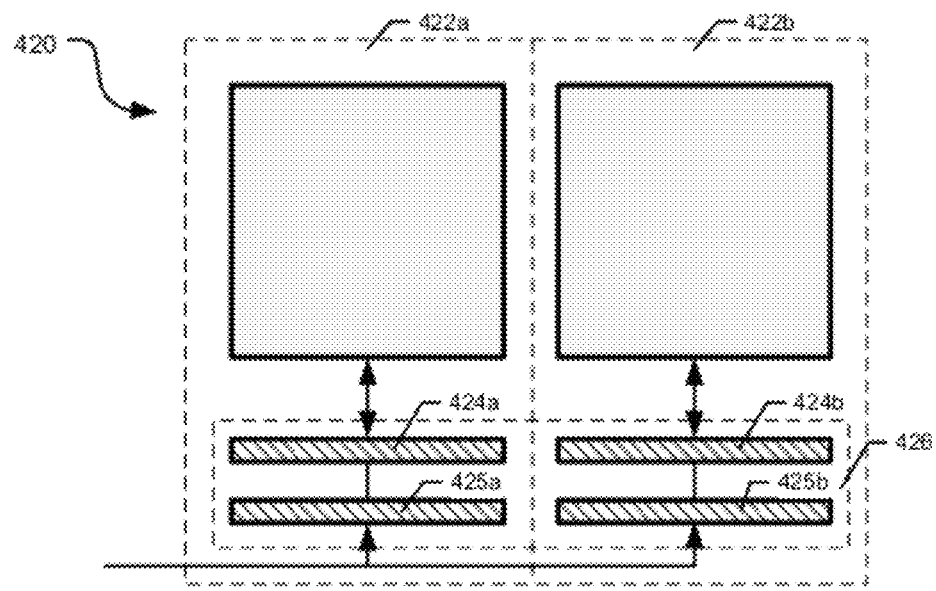
FIG. 4 shows an example of a memory chip having two planes.

FIG. 4 shows a memory array 420 that is formed as two planes 422a, 422b, each having an array portion and an on-chip cache portion. A metablock extends across both planes and consists of one block in each plane. A metapage also extends across both planes. The present application uses the term "page" to refer to the unit of programming of the memory array, which may be a page of a single plane (sometimes referred to as a "die-page") where one page is programmed at a time, or a meta-page that extends across multiple planes where planes are programmed in parallel. Thus, the term page buffer may refer to the data latches that hold data to be programmed to a meta-page rather than just the data latches that hold data for the portion of the meta-page in a single plane. The page buffers connected to a particular memory array, located on the same chip as the memory array, form an on-chip cache. Data latches 424a, 424b form a page buffer in FIG. 4 because data latches 424a, 424b together hold all the data for a page that extends across both planes. Data latches 424a, 424b, 425a, and 425b together form on-chip cache 426. In general, techniques described here with respect to a page will be understood to apply equally to a single die-page within a plane, or to a page (metapage) that extends across two or more planes of a memory array.

Problems may arise in memory systems where there is a failure to write data to the nonvolatile memory. In a typical arrangement, data is sent by a memory controller to a memory chip, where the data is written from a set of data latches (a page buffer) to the nonvolatile memory. However, if there is some error during the writing operation, the copy of the data in the data latches will not generally be recoverable and no complete copy of the data exists in nonvolatile memory (since an error has occurred which prevented it from being written). In some memory systems, a safe (backup) copy of the data is maintained in the controller RAM until the data is confirmed as written. Then, after the data is confirmed as written, the next data is received from the host, displacing the backup copy in the controller RAM.

Application Ser. No. 12/485,827, entitled, "Program failure handling in nonvolatile memory," filed on the same date as the present application, and hereby incorporated by reference in its entirety for all purposes, describes techniques for handling program failure. Specifically, program failure during programming of data in an SLC memory, or during programming of lower-page data in an MLC memory is addressed in that application.

In MLC memory systems, program failure may occur during programming of lower-page data or during programming of upper-page data (or during programming of middle-page data if more than two bits are stored per cell). According to an embodiment of the present invention, an on-chip cache has sufficient page buffers so that it can store safe copies of both upper-page data and lower-page data at the same time (and may also store middle-page data, if any). Sufficient page buffers may be provided in an on-chip cache so that safe copies of any data that is not yet stored in the nonvolatile memory array are maintained in the on-chip cache. This means that safe copies do not have to be maintained in the controller RAM or elsewhere, thus permitting controller RAM to be smaller and cheaper. Also, performance can be improved because new data can be transferred from a host while previous data is being programmed to the memory array.

FIG. 5 shows an example of a memory system 530 with an on-chip cache 532 which includes five page buffers 532a-e. Each page buffer includes data latches that hold the same amount of data as a page in the memory array 534. For multi-plane memory systems, a page includes two or more physical-pages (where a physical page is the smallest physical unit of programming of the memory array). While five page buffers are shown in this particular example, in other examples, different numbers of page buffers may be used. In particular, in memory systems that store more than two bits per cell, additional page buffers may be provided to allow storage of middle-page data. The term "middle-page data" is used here to refer to any data that is stored in the same cells as upper-page data and lower-page data and does not necessarily mean that three bits are stored per cell. There may be more than one middle-page. For example, if each cell stores four bits of data, then in addition to an upper-page and a lower-page, there are two middle-pages.

In one example, the on-chip cache 532 of FIG. 5 is used to store safe copies of all data that has been received from a host but is not yet stored in the nonvolatile memory array. During programming of upper-page data, upper-page and lower-page target data (a copy that is used to write to the memory array) occupy two page buffers. At the same time, safe copies of the upper-page and lower-page data are maintained in two other page buffers. One other buffer is used to receive additional data from the memory controller in parallel with programming of the memory array.

FIG. 6A shows an example where page buffer 532a and data buffer 532b contain upper-page and lower-page target data that is being written to target area 536 in the memory array 534. At the same time, data buffer 532c and data buffer 532d contain safe copies of the upper-page data and lower-page data. Data buffer 532e may be used for transfer of additional data from the memory controller in parallel with the writing of data to the memory array. For example, the next portion of data to be programmed can be transferred to data buffer 532e during programming of the target data in data buffers 532a-b, and while safe copies of the data being programmed are maintained in data buffers 532c-d.

FIG. 6B shows a write fail occurring during writing of upper-page data to the memory array 534. This leaves the target copies of upper-page data and lower-page data in data buffers 532a-b in an unrecoverable condition. Also, because the data was not successfully written to the memory array, the data cannot be recovered from the memory array 534. It will be understood that in writing upper-page data, memory cells that were successfully programmed with lower-page data are further programmed, and where a write fail occurs during programming of upper-page data, such cells may be in an intermediate state so that lower page data cannot be recovered from them. Also, the process of programming data from a target page buffer affects the data in the target page buffer so that it is no longer readable. Thus, in the situation shown in FIG. 6B, neither upper-page data nor lower-page data can be recovered from the target area 536, or from data buffers 532a-b.

FIG. 6C shows recovery of upper-page data and lower-page data from data buffers 532c-d. In particular, data buffers 532c-d contain safe copies of upper-page data and lower-page data, so these copies are not affected by programming. The safe copies of both upper-page data and lower-page data are transferred 638 to data buffers 532a-b. Then data buffers 532a-b are used as target data buffers to program the data 640 to an alternative location 642 in the memory array.

FIG. 7A shows a timing diagram of data transfer according to a data handling scheme which keeps a safe copy of data in controller RAM. Because controller RAM is occupied by a safe copy of data until that data is written to the memory array, new data is not transferred from the host until the previous data has successfully completed programming. For example, the first portion of data is transferred 746 from the host and is copied to the on-chip cache in two chunks 748a-b (corresponding to the two planes of the memory). A copy of the first portion of data remains in the controller. Once the first portion of data is in the on-chip cache, the data is programmed to the memory array 750. When the first portion of data is confirmed as being successfully programmed to the memory array, the safe copy in the controller is no longer needed and a second portion of data is transferred 752 to the controller thereby displacing the first portion of data from controller RAM. The second portion of data is then programmed in the same way, and when programming of the second portion of data is complete, a third portion of data is transferred 754 from the host, and when programming of the third portion of data is complete, a fourth portion of data is transferred 756 from the host. FIG. 7A shows storage in an MLC memory, with programming of upper-page data (e.g. second portion of data 751) taking longer than programming of lower-page data (e.g. first portion of data 750). In addition, this scheme does not allow any program failure recovery where failure occurs during writing of upper page (and also middle page if 3 or more bits per cells) programming. Even if a safe copy of upper page data resides in controller RAM, the program failure during upper page programming has already corrupted the data residing in the corresponding lower page since both share the same transistor cells. Controller RAM does not generally have the corresponding lower page data as safe copy.

FIG. 7B shows a timing diagram according to an alternative data transfer scheme in which safe copies of upper-page data and lower-page data are maintained in on-chip cache instead of being maintained in controller RAM. A first portion of data is transferred 758 from a host and is transferred to on-chip cache as before 760a-b. However, in this case, a second portion of data begins transferring 762 immediately after the first portion of data is transferred 758. The second portion of data displaces the first portion of data from controller RAM, so that the controller does not maintain a copy of the first portion of data at this stage. The first portion of data is programmed to the memory array 764 in parallel with transfer of the second portion of data 762 to the controller. The second portion of data also is also transferred 766a-b to the on-chip cache during writing of the first portion of data 764. In this example, programming of the second portion of data 768 begins immediately after programming of the first portion of data 764. This is possible because the second portion of data has already been transferred to on-chip cache 766a-b in parallel with programming the first portion of data 764. A third portion of data is transferred 770 from the host to the controller in parallel with writing the second portion of data 768. At a point during the programming 768 of the second portion of (upper-page) data, sufficient space is available in the on-chip cache to accept the third portion of data because a page buffer is provided for receiving additional data from the controller in addition to the page buffers holding target copies and safe copies of data being programmed (e.g. page buffer 5 of FIG. 6A-C. When the third portion of data has transferred 772a-b to the on-chip cache, a fourth portion of data is transferred 774 from the host. The second and third portions of data are programmed 776, 778 immediately after programming 768 of the second portion of data. As can be seen from a comparison of FIGS. 7A and 7B, the scheme of FIG. 7B provides a time saving 780 because of parallel transfers of data. Also, because data is transferred from the memory controller in chunks that are less than the data of a full page in FIG. 7B, the controller RAM may be smaller than a page. In contrast, the scheme of FIG. 7A maintains data of a full page in controller RAM, which may require controller RAM to be bigger than it would otherwise have to be.

Figure 8:
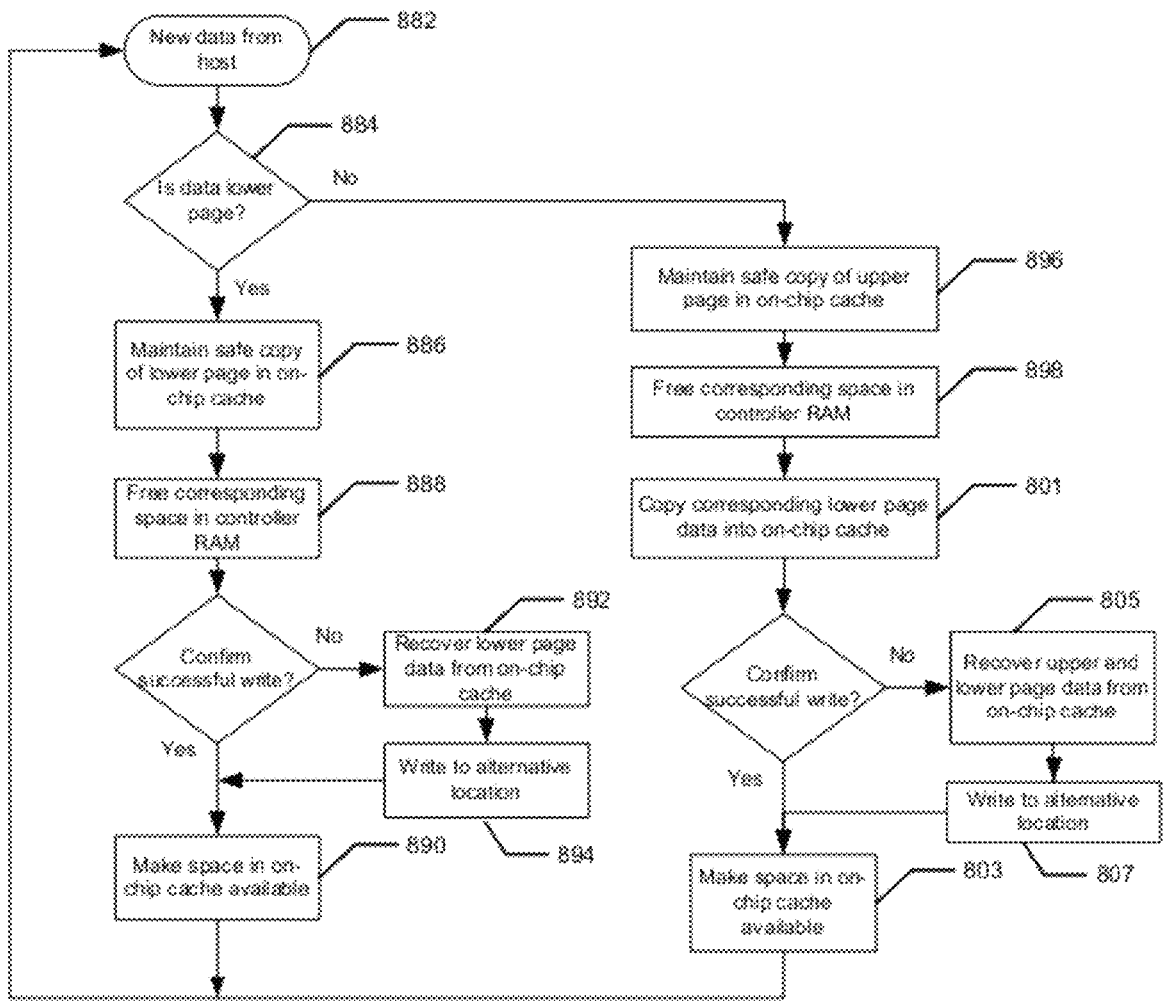
FIG. 8 shows a flowchart for a data transfer and storage scheme.

FIG. 8 shows a flowchart for a data transfer and storage scheme according to an embodiment of the present invention. New data is received 882 from a host and a determination is made 884 as to whether the data is lower-page data. If the data is lower page data, then a safe copy of the data is maintained 886 in the on-chip cache. The space occupied by the data in the controller RAM is indicated as free 888, thus allowing more data to be transferred from the host. The data is written from the on-chip cache to the memory array and if the writing is confirmed as successful, then the safe copy of the data in on-chip cache is no longer needed and the page buffer containing the safe copy is made available 890 for additional data from the controller. If the data is not confirmed as successfully written (write fail), then the lower-page data is recovered 892 from the on-chip cache and is written 894 to an alternative location in the memory array. If the data is not lower-page data, i.e. is upper-page or middle-page data, then a copy of the data is maintained 896 as a safe copy in the on-chip cache. The copy of the upper-page data in controller RAM is not needed when a safe copy is available in on-chip cache, so the corresponding space in controller RAM is indicated as free 898 so that more data can be transferred from the host. Because lower-page data may be unrecoverable from the memory array if a write fail occurs during programming of upper page data, the lower-page data is copied 801 to the on-chip cache prior to programming of upper-page data. Also, any middle-page data that might be affected may be copied to on-chip cache at this state. Then, the upper-page data is written to the memory array. If the write is successful, then the space in the on-chip cache corresponding to the upper-page data, along with any lower-page (or middle-page) data copied from the memory array to the on-chip cache, is made available 803 for additional data from the controller. If the upper-page data is not confirmed as successfully written (write fail) then the upper-page data and lower-page data (and any middle-page data) are recovered 805 from the safe copies in on-chip cache. These pages of data are then written 807 to an alternative location in the memory array.

Figure 9:
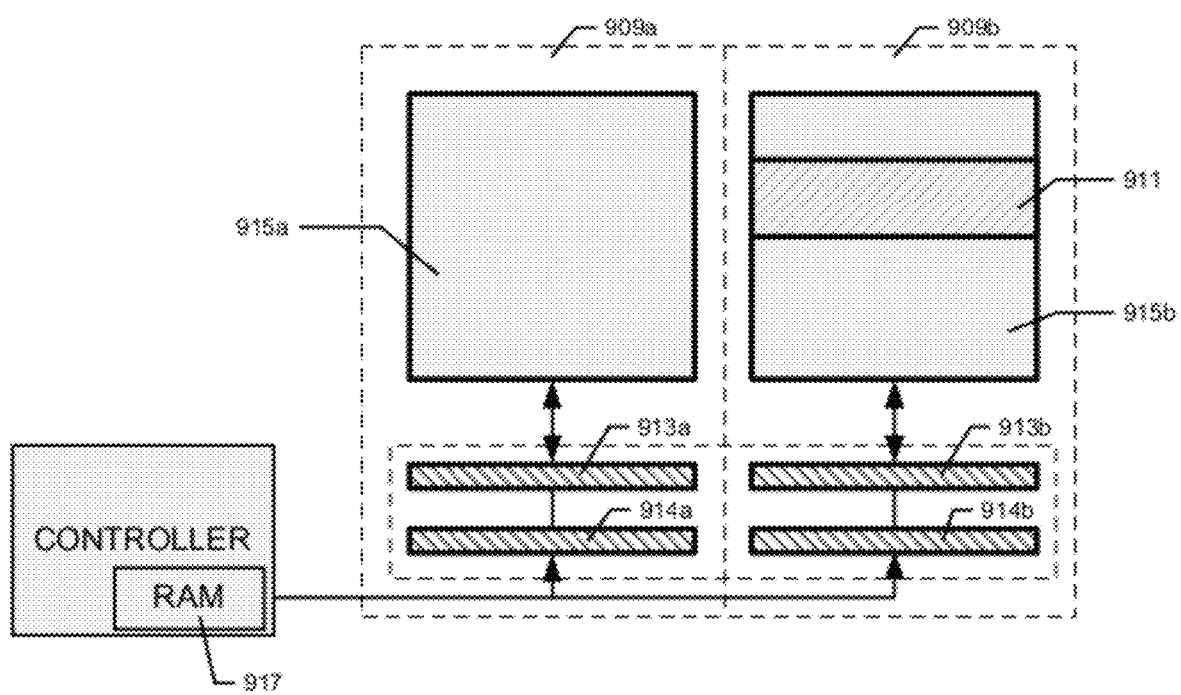
FIG. 9 shows data transfer where safe copies are maintained in one plane of a two plane array.

In some cases, a temporary storage area may be limited to one or more planes in a multi-plane array. Recovery in such systems is similar to the examples described above, but with data transferred from one plane to another via controller RAM before being written to a temporary storage area in the memory array. FIG. 9 shows an example of a memory system with two planes 909a, 909b. A write fail occurs during programming of data in first plane 909a. The area for temporary storage of data 911 is in the second plane 909b. In this example, the second plane 909b completes programming (both planes are programmed in parallel) so that the page buffers 913b, 914b of the second plane become available (their data is safely stored in the memory array 915b). Then, any valid data that is stored in controller RAM 917 is transferred to the second plane 909b and is programmed to the temporary storage area 911 thus making space available in controller RAM 917. Next, safe copies of data from page buffers 913a, 914a of the first plane 909a are transferred to controller RAM 917. These copies are then transferred to the page buffers 913b, 914b of the second plane 909b and are written to the temporary storage area 911. Thus, the end result is that safe copies of data are transferred to the temporary storage area even though the temporary storage area is on another plane. In addition, a temporary storage area may be limited to or pre-existing on a different die or chip. Similar recovery can also be applied in such system.

While the above examples show particular numbers of page buffers, it will be understood that the present invention is not limited to particular number of page buffers and that the number of page buffers used will depend on the number of pages of data for which safe copies are to be maintained in on-chip cache. For example, in a memory system that stores three bits per cell (lower page, middle page, and upper page), it may be desirable to have page buffers for target copies of data for each page and page buffers for safe copies of each page, plus one or more page buffers to allow new data to be transferred from the host during programming. Thus, seven or more page buffers may be used. If more than three bits are stored per cell, then more page buffers may be used.

All patents, patent applications, articles, books, specifications, other publications, documents and things referenced herein are hereby incorporated herein by this reference in their entirety for all purposes. To the extent of any inconsistency or conflict in the definition or use of a term between any of the incorporated publications, documents or things and the text of the present document, the definition or use of the term in the present document shall prevail.

Although the various aspects of the present invention have been described with respect to certain preferred embodiments, it is understood that the invention is entitled to protection within the full scope of the appended claims.

What is claimed is:

1. A method of managing data transfer from a host to a nonvolatile memory array that stores more than one bit per cell, comprising:
receiving lower-page data and upper-page data from a host;
buffering the lower-page data and the upper-page data in a memory controller volatile memory;
reading the lower-page data from the memory controller volatile memory;
storing a safe copy of the lower-page data in a first page buffer of an on-chip cache of a nonvolatile memory array coupled to the memory controller, the volatile memory being distinct from the on-chip cache;
storing a target copy of the lower-page data into a second page buffer of the on-chip cache;
reading the upper-page data from the memory controller volatile memory;
storing a safe copy of the upper-page data in a third page buffer of the on-chip cache;
storing a target copy of the upper-page data in a fourth page buffer of the on-chip cache; and
while the safe copy of the lower-page data is still stored in the first page buffer and while the safe copy of the upper-page data is still stored in the third page buffer:
writing the upper-page data from the fourth page buffer to the non-volatile memory array; and
when a write failure occurs during the writing of the upper-page data from the fourth page buffer to the non-volatile memory array then recovering the upper-page data from the third page buffer and writing the recovered upper-page data to the nonvolatile memory array.

2. The method of claim 1 wherein the upper-page data is to be programmed to cells of a first word line, and the lower-page data is to be programmed to the cells of the first word line.

3. The method of claim 1 wherein during the writing of the upper-page data from the fourth page buffer to the nonvolatile memory array or during the writing of the lower-page data from the second page buffer to the nonvolatile memory array, while the safe copies of the upper-page data and lower-page data are stored in the third and first page buffers, respectively, additional data is transferred to the on-chip cache.

4. The method of claim 1 wherein the nonvolatile memory array is located in a flash memory card and the data transfer takes place through a standard interface between the host and the flash memory card.

5. The method of claim 1, wherein recovering the upper-page data from the third page buffer and writing the recovered upper-page data to the nonvolatile memory array comprises:
recovering the upper-page data from the third page buffer;
storing the recovered upper-page data in the fourth page buffer; and
writing the recovered upper-page data from the fourth page buffer to the nonvolatile memory array.

6. The method of claim 1, further comprising, after the safe copy of the upper-page data is stored in the third page buffer of the on-chip cache and prior to the upper-page data being written from the fourth page buffer to the nonvolatile memory array, displacing or removing the upper-page data from the volatile memory of the memory controller.

7. The method of claim 1 further comprising, when a write failure occurs during writing of the lower-page data or during writing of the upper-page data, then recovering the lower-page data from the first page buffer and writing the recovered lower-page data to the nonvolatile memory array.

8. The method of claim 7, wherein recovering the lower-page data from the first page buffer and writing the recovered lower-page data to the nonvolatile memory array comprises:
recovering the lower-page data from the first page buffer;
storing the recovered lower-page data in the second page buffer; and
writing the recovered lower-page data from the second page buffer to the nonvolatile memory array.

9. The method of claim 1 wherein the nonvolatile memory array stores more than two bits per cell so that middle-page data is stored in cells of the memory array.

10. The method of claim 3 further comprising:
storing a safe copy of any middle-page data in a fifth page buffer of the on-chip cache;
storing a target copy of the any middle-page data in a sixth page buffer of the on-chip cache; and
while the safe copy of the lower-page data is still stored in the first page buffer, while the safe copy of the any middle-page data is still stored in the fifth page buffer, and while the safe copy of the upper-page data is still stored in the third page buffer:
when a write failure occurs, then recovering the middle-page data from the fifth page buffer of the on-chip cache and writing the recovered middle-page data to the nonvolatile memory array.

11. The method of claim 10, wherein recovering the middle-page data from the fifth page buffer and writing the recovered middle-page data to the nonvolatile memory array comprises:
recovering the middle-page data from the fifth page buffer;
storing the recovered middle-page data in the sixth page buffer; and writing the recovered middle-page data from the sixth page buffer to the nonvolatile memory array.

12. A method of managing data transfer from a host to a nonvolatile memory array that stores more than one bit per cell, comprising:
receiving lower-page data and upper-page data from a host;
buffering the lower-page data and the upper-page data in a memory controller volatile memory;
reading the lower-page data from the memory controller volatile memory;
storing a safe copy of the lower-page data in a first page buffer of an on-chip cache of a nonvolatile memory array, the volatile memory being distinct from the on-chip cache;
storing a target copy of the lower-page data into a second page buffer of the on-chip cache;
reading the upper-page data from the memory controller volatile memory;
storing a safe copy of the upper-page data in a third page buffer of the on-chip cache;
storing a target copy of the upper-page data in a fourth page buffer of the on-chip cache; and
while the safe copy of the lower-page data is still stored in the first page buffer and while the safe copy of the upper-page data is still stored in the third page buffer:
writing the upper-page data from the fourth page buffer to the non-volatile memory array; and
when a write failure occurs during the writing of the upper-page data from the fourth page buffer to the non-volatile memory array, then recovering the upper-page data from the third page buffer and writing the recovered upper-page data to the nonvolatile memory array; wherein:
the lower-page data includes data for two or more die-pages, and
data for an individual die-page is displaced from the memory controller as the individual die-page data is stored in the on-chip cache, prior to completion of storage of data of all die-pages of the lower-page data in the on-chip cache.

13. A method of managing data in a memory system that includes a memory controller and a buffered memory array comprising:
buffering lower-page data in an on-chip cache;
discarding the lower-page data from the memory controller prior to writing the lower-page data to the memory array;
buffering upper-page data in the on-chip cache;
discarding the upper-page data from the memory controller prior to writing the upper-page data to the memory array; and
if the writing of upper-page data is unsuccessful, then recovering the upper-page data from the on-chip cache.

14. The method of claim 13 further comprising, if the writing of upper-page data is unsuccessful, then recovering the lower-page data from the on-chip cache.

15. The method of claim 13 wherein after lower-page data is discarded from the memory controller, and prior to completing writing of the lower-page data to the memory array, additional data is received in the on-chip cache.

16. A memory system comprising:
a memory controller;
a nonvolatile memory array that stores at least a lower-page bit and an upper-page bit in each cell; and
an on-chip cache interposed between the memory controller and the nonvolatile memory array, wherein the on-chip cache concurrently maintains safe copies of upper-page data and lower-page data to be written to a group of cells of the memory array until the upper-page data and the lower-page data are confirmed as written, the upper-page data and lower-page data being removed from the memory controller prior to being confirmed as written.

17. The memory system of claim 16 wherein the on-chip cache comprises five page buffers, an input page buffer, two safe copy page buffers, and two target copy page buffers.

18. The memory system of claim 16 wherein the memory array stores n-bits per cell and the on-chip cache contains at least 2n+1 page buffers.

19. The memory system of claim 18 wherein the on-chip cache contains n page buffers that store safe copies of data, n page buffers that store target data, and one page buffer that receives new data.

20. The memory system of claim 18 wherein the memory system is contained in a removable flash memory card that has a standard interface.

* * * * *

UNITED STATES PATENT AND TRADEMARK OFFICE
CERTIFICATE OF CORRECTION

PATENT NO. : 8,307,241 B2
APPLICATION NO. : 12/485846
DATED : November 6, 2012
INVENTOR(S) : Chris Nga Yee Avila et al.

Page 1 of 1

It is certified that error appears in the above-identified patent and that said Letters Patent is hereby corrected as shown below:

In column 11, line 64, change "array then" to --array, then--.

In column 12, line 47, change "claim 3" to --claim 9--.

Signed and Sealed this
Twelfth Day of February, 2013

Teresa Stanek Rea
*Acting Director of the United States Patent and Trademark Office*